(12) United States Patent
Tarau et al.

(10) Patent No.: US 12,369,278 B1
(45) Date of Patent: Jul. 22, 2025

(54) MULTI-CONDENSER VARIABLE CONDUCTANCE HEAT PIPE

(71) Applicant: ADVANCED COOLING TECHNOLOGIES, INC., Lancaster, PA (US)

(72) Inventors: Calin Tarau, Downingtown, PA (US); Jeffrey Diebold, Chesterbrook, PA (US); Kuan-Lin Lee, West Chester, PA (US)

(73) Assignee: ADVANCED COOLING TECHNOLOGIES, INC., Lancaster, PA (US)

( * ) Notice: Subject to any disclaimer, the term of this patent is extended or adjusted under 35 U.S.C. 154(b) by 609 days.

(21) Appl. No.: 17/652,350

(22) Filed: Feb. 24, 2022

(51) Int. Cl.
H05K 7/20 (2006.01)

(52) U.S. Cl.
CPC ..... *H05K 7/20381* (2013.01); *H05K 7/20318* (2013.01); *H05K 7/20336* (2013.01)

(58) Field of Classification Search
CPC .......... H05K 7/20381; H05K 7/20318; H05K 7/20336
USPC ...................................... 165/104.13
See application file for complete search history.

(56) References Cited

U.S. PATENT DOCUMENTS

| | | | | |
|---|---|---|---|---|
| 4,799,537 A * | 1/1989 | Hoke, Jr. | ................. | F28D 15/06 165/104.27 |
| 5,036,905 A * | 8/1991 | Eninger | ................. | B64G 1/506 244/172.6 |
| 5,368,786 A * | 11/1994 | Dinauer | ................. | F24F 3/14 261/130 |
| 6,230,790 B1 * | 5/2001 | Hemingway | ...... | H05K 7/20336 165/274 |
| 6,591,899 B1 * | 7/2003 | Yee | ........................ | B64G 1/506 165/104.14 |
| 6,655,375 B2 * | 12/2003 | Terraneo | ................. | F24S 60/30 126/635 |
| 6,675,887 B2 * | 1/2004 | Garner | .................... | F28D 15/06 165/274 |
| 6,684,941 B1 * | 2/2004 | Cao | .................... | F28D 15/0266 165/104.25 |
| 6,840,304 B1 * | 1/2005 | Kobayashi | .......... | F28D 15/0266 165/104.32 |

(Continued)

OTHER PUBLICATIONS

Hartenstine, et al. "Pressure Controlled Heat Pipe Solar Receiver for Regolith Oxygen Production with Multiple Reactors".

(Continued)

*Primary Examiner* — Raheena R Malik
(74) *Attorney, Agent, or Firm* — McNees Wallace & Nurick LLC

(57) ABSTRACT

In some implementations, a thermal management system includes a heat source and a heat pipe connected to the heat source and configured to transfer thermal energy from the heat source to a plurality of condensers, each of the plurality of condensers branching off from a main pipe of the heat pipe. The heat pipe can be a variable conductance heat pipe containing a working fluid vapor. Each condenser contains a reservoir of non-condensable gas (NCG). At least one of the condensers can be controlled by heating/cooling the respective reservoir of NCG, by reservoir volume changing via bellows, and/or by NCG amount changing via NCG insertion/extraction.

21 Claims, 10 Drawing Sheets

(56) References Cited

U.S. PATENT DOCUMENTS

| | | | |
|---|---|---|---|
| 6,938,679 B1* | 9/2005 | Ito | F28D 15/0275 165/41 |
| 6,989,518 B2* | 1/2006 | Terano | B29C 65/3668 53/329.2 |
| 7,061,446 B1* | 6/2006 | Short, Jr | H01Q 21/00 343/893 |
| 8,047,268 B1* | 11/2011 | Kroliczek | F28D 15/046 165/274 |
| 9,261,310 B2* | 2/2016 | Fried | F28D 15/0266 |
| 9,696,096 B2* | 7/2017 | Uchida | F28D 15/0266 |
| 11,051,431 B2* | 6/2021 | Marcoccia | H05K 7/20836 |
| 2003/0183381 A1* | 10/2003 | Garner | F28D 15/06 165/274 |
| 2004/0112583 A1* | 6/2004 | Garner | F28D 15/0275 165/274 |
| 2008/0099189 A1* | 5/2008 | Suh | F28D 15/06 165/104.21 |
| 2008/0308259 A1* | 12/2008 | Garner | F28D 15/046 165/104.21 |
| 2010/0051254 A1* | 3/2010 | Ipposhi | F28F 13/14 165/274 |
| 2013/0083482 A1* | 4/2013 | Uchida | F28D 15/046 165/104.26 |
| 2013/0306278 A1* | 11/2013 | Hoang | F28D 15/043 165/104.26 |
| 2015/0101330 A1* | 4/2015 | Rice | F01K 25/08 60/671 |
| 2021/0108860 A1* | 4/2021 | Kulkarni | F28D 15/0275 |

OTHER PUBLICATIONS

Dyson, R.W., et al. "Solid-State Exergy Optimized Electric Aircraft Thermal and Fault Management," AIAA Propulsion and Energy Forum, 2020. AIAA 2020-3576.

* cited by examiner

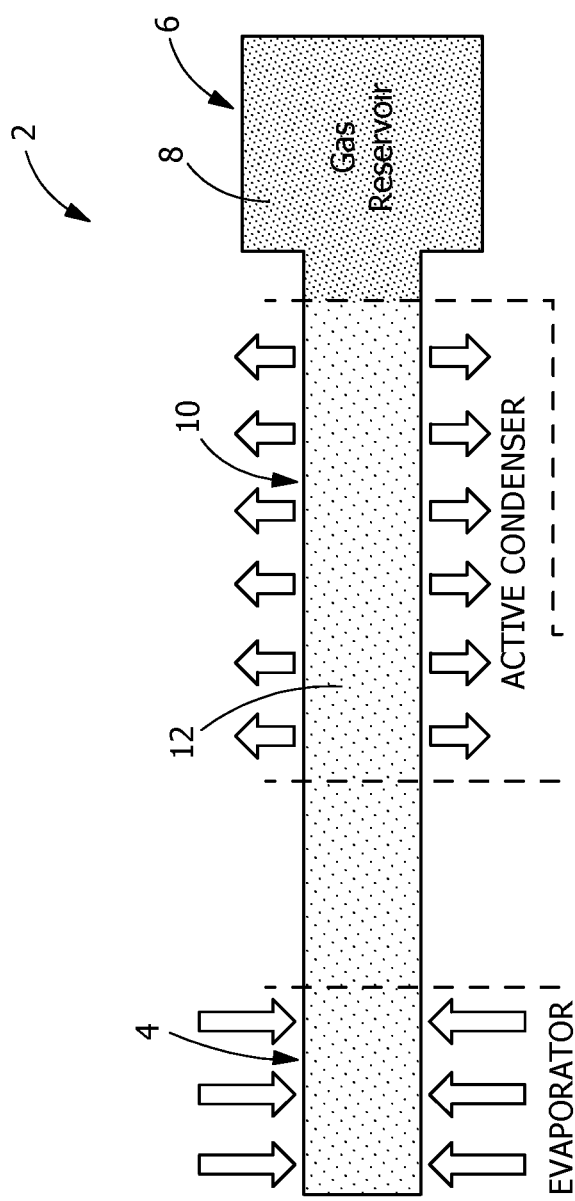
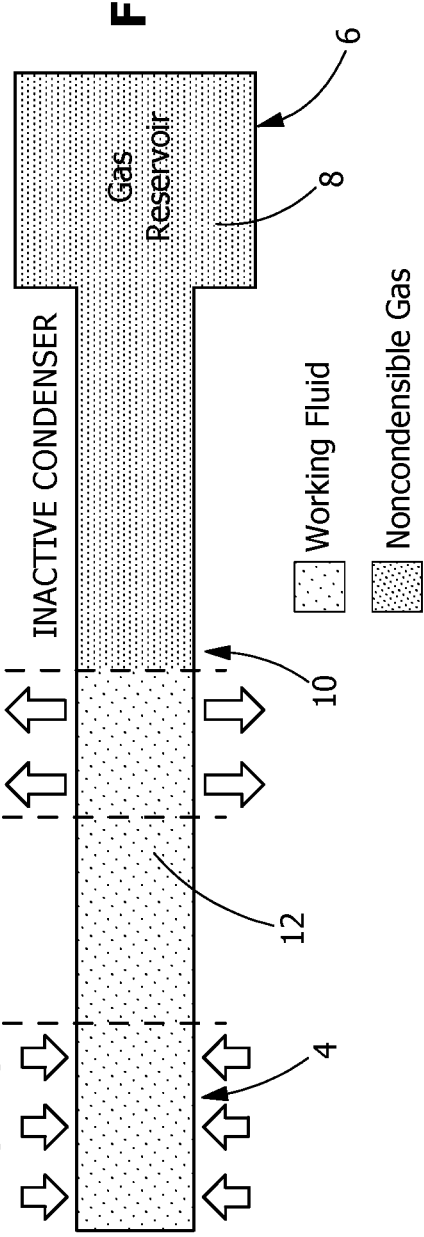

MULTI-CONDENSER VARIABLE CONDUCTANCE HEAT PIPE

STATEMENT REGARDING FEDERALLY SPONSORED RESEARCH

This invention was made with government support under contract number 80NSSC20C0055 awarded by the National Aeronautics and Space Administration (NASA). The government has certain rights in the invention.

TECHNICAL FIELD

The present disclosure relates to a thermal management system. More specifically, the present disclosure relates to a thermal management system for controlling temperature of heat sources used in aircrafts.

BACKGROUND

Thermal management represents a significant design challenge in the development of aircrafts, e.g., MW-class commercial electric aircraft. To solve this challenge, a thermal management system that can recycle, deliver and reject all low-grade waste generated within the aircraft is required. This is particularly challenging for electric aircraft because the large number of electronic components arranged throughout the aircraft generate significant waste heat. However, at relatively low temperature, the waste heat is not useful and becomes difficult to reject (discard, eliminate, etc.) from the aircraft.

In one approach, a thermo-acoustic heat pump is utilized to raise the temperature of low-grade waste heat. Waste heat from various sources, at low temperature, is transferred to the thermo-acoustic heat pump which raises the temperature of the waste heat. This new high-temperature waste heat can then be delivered, via a network of heat pipes, to various end users (e.g., auxiliary power unit, combustion air, bypass air, oil loop, anti-icing, etc.) on the aircraft requiring thermal energy or rejected from the aircraft. By reusing a significant portion of the waste heat, a mass penalty associated with the thermal management system can be offset by improving the overall system efficiency.

Further, in conventional thermal management systems on aircraft, waste heat can be transported through the aircraft by actively pumping a single-phase fluid, such as, engine oil or fuel. However, these systems result in significant weight penalties due to the need for pumps and large piping to account for pressure drops in the system. Also, relatively low heat transfer coefficients result in large temperature drops in the system. As such, the power requirements to pump the coolant results in a reduction in net propulsive efficiency of the aircraft. In addition, due to the active nature of the system involving moving parts (e.g., pumps and valves), maintenance issues are a constant concern. These shortcomings are exacerbated as aircraft become increasingly electrified due to the large number of low temperature heat sources distributed throughout the aircraft. This waste heat is not useful for performing work and is difficult to reject because of its low temperature.

There remains a need to develop a lightweight, controllable, and reliable heat pipe-based system to transport high-grade waste throughout the aircraft.

SUMMARY

In an exemplary embodiment, a thermal management system includes a heat source and a heat pipe connected to the heat source and configured to transfer thermal energy from the heat source to a plurality of condensers, each of the plurality of condensers branching off from a main pipe of the heat pipe. The heat pipe can be a variable conductance heat pipe containing a working fluid vapor. At least one of the condensers is controlled upon an activation of another of the plurality of condensers.

In a further exemplary embodiment, a thermal management system includes a heat pipe configured to transfer thermal energy from a heat source to a plurality of condensers, the heat pipe can be a variable conductance heat pipe containing a working fluid vapor. Each of the plurality of condensers includes a reservoir containing a non-condensable gas, and at least one of the plurality of condensers is controlled by at least one of: heating or cooling the respective reservoir of the non-condensable gas, changing a volume of the respective reservoir, or changing an amount of non-condensable gas in the respective reservoir.

In yet a further embodiment, a method of controlling heat being delivered to end users via a heat pipe is disclosed. The method includes extracting waste heat from a heat source, transferring the waste heat to a plurality of condensers connected to a variable conductance heat pipe containing a working fluid, and controlling at least one of the plurality of condensers to operate the working fluid to flow to the other plurality of condensers.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIGS. 3a and 3b are schematic views of a variable conductance heat pipe in operation.

It should be noted that these Figures are intended to illustrate the general characteristics of methods, structure and/or materials utilized in certain example embodiments and to supplement the written description provided below. These drawings are not, however, to scale and may not accurately reflect the precise structural or performance characteristics of any given embodiment, and should not be interpreted as defining or limiting the range of values or properties encompassed by example embodiments. For example, the relative thicknesses and positioning of, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

One of several features of the present disclosure is to provide a passive, lightweight and controllable system for distributing high-grade waste heat throughout an aircraft. Heat pipes are passive two-phase heat transfer devices that take advantage of latent heat of vaporization of a fluid to transport large quantities of heat at a constant temperature. Transferring heat via heat pipes solves many of the challenges of pumped single-phase cooling systems currently onboard most aircrafts. Heat pipes are passive solid-state devices that require no electric power and have no moving parts. In addition, heat pipes are relatively simple in design.

The present heat transport system improves upon the basic heat pipe by reducing the number of heat pipes required to carry thermal energy to various end users and by adding active solid-state (no-moving parts) control to the heat pipe system. The new innovative heat transport system includes a heat pipe with a single evaporator connected to multiple condensers that each branch off from a main pipe. The use of multiple condensers connected to a single evaporator reduces the total number of heat pipes required to deliver heat to multiple locations. Heat is passively transferred through the continuous vaporization and condensation of a working fluid. With this system, a single evaporator can supply heat to any number of end users. Moreover, at an end of each condenser is a reservoir for storing non-condensable gas (NCG). By actively controlling the temperature of the NCG in the reservoirs, the heat transfer at each condenser (i.e., end-user) can be controlled.

Figure 1:
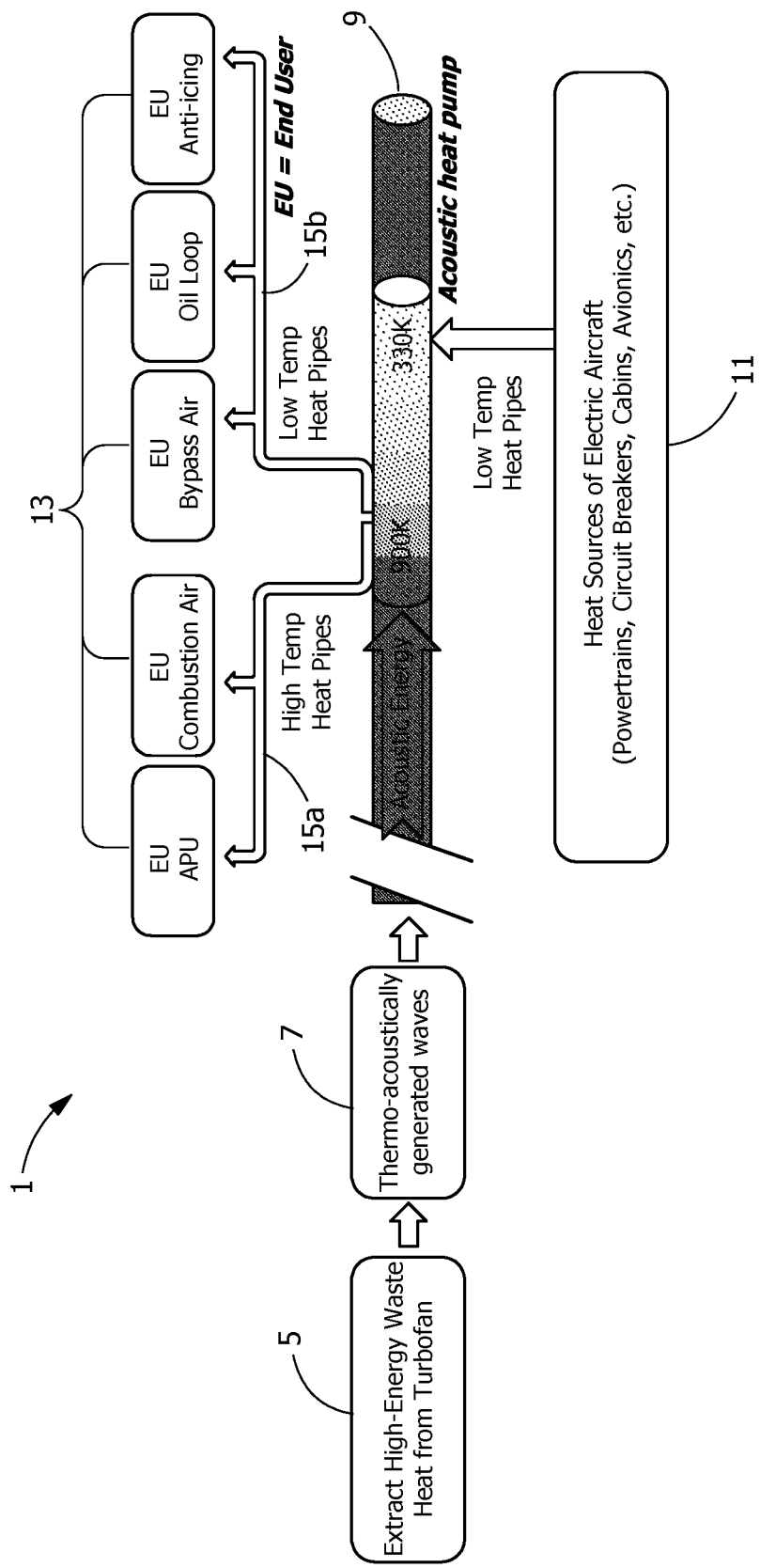
FIG. 1 is a graphical representation of a heat pipe heat delivery system.

FIG. 1 illustrates an approach for a thermal management system 1 using a basic heat pipe for an aircraft. For example, the thermal management system 1 extracts high temperature waste heat from an exhaust of a turbofan 5 and used to thermo-acoustically generate acoustic waves 7.

These waves 7 are then transported throughout the aircraft through acoustic wave guides to various acoustic heat pumps 9. The acoustic heat pumps 9, powered by the acoustic waves 7, are used to actively refrigerate (or cool) the various heat sources 11 (electronics, powertrains, circuit breakers, cabins, avionics, etc.). The acoustic heat pump 9 raises the temperature of the waste heat so that it can be recycled by delivering the recycled waste heat to various "end users" 13 onboard the aircraft that may require thermal energy. By raising the temperature of the waste heat, it can be more efficiently delivered to the end users 13 and/or rejected from the aircraft. There are a variety of potential end users onboard the aircraft that would benefit from receiving recycled thermal energy including, for example: preheating combustion air, preheating air into an auxiliary power unit, heating any surface requiring protection (wings, tail, engine nacelle, control surface, instruments), engine by-pass air, outer mold line, cabin, batter, oil coolant loop, ram air, fuel, etc. It should be appreciated that other end users may receive the recycled thermal energy besides the ones listed herein.

The waste heat with elevated temperature is delivered to the end users 13 via a network of heat pipes (e.g., high temperature heat pipes 15a and/or low temperature heat pipes 15b). In some implementations, the heat pipes 15a, 15b are passive two-phase heat transfer devices. For example, heat can be absorbed in an evaporator (not shown) by vaporizing a working fluid. The newly formed vapor flows to a condenser (not shown) where the vapor condenses back into a liquid before flowing back to the evaporator forming a closed loop. In order to improve the heat pipe delivery network, the present disclosure has developed a two-phase heat transport system that reduces the number of required heat pipes and provides solid-state (no moving parts) thermal control. This thermal control provides the ability to modulate the heat being delivered to the various end users based on real time requirements.

Figure 2:
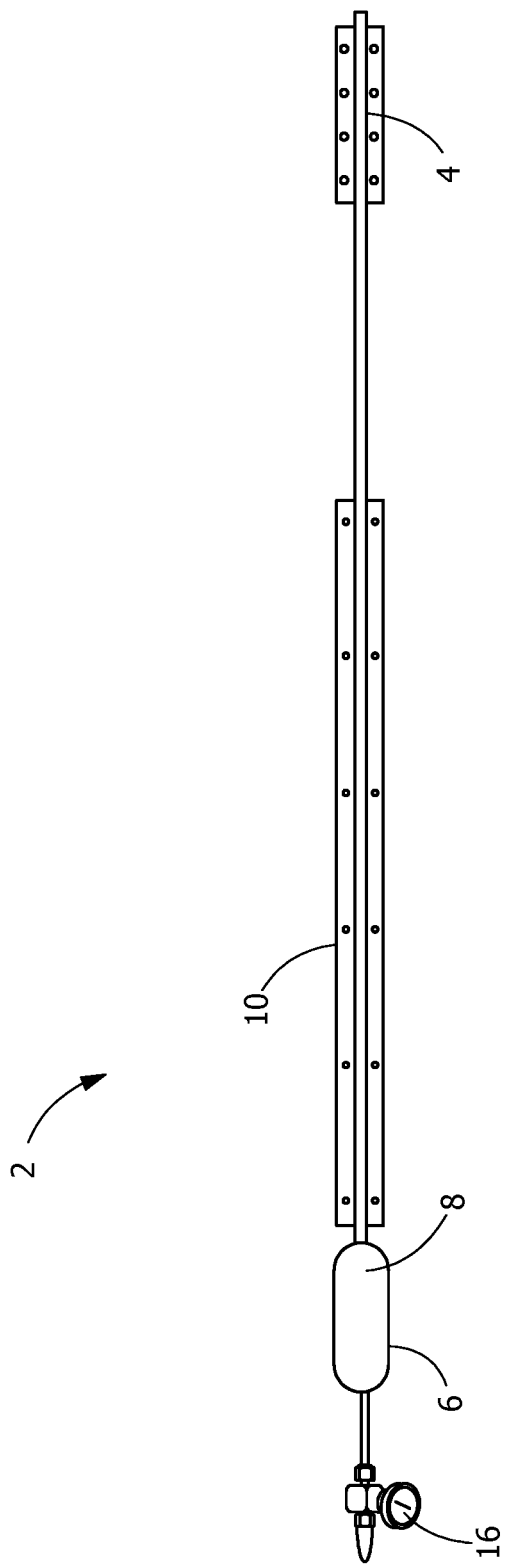
FIG. 2 is a schematic view of a variable conductance heat pipe, according to an example embodiment of the present disclosure.

Referring to FIG. 2, a two-phase heat transport system with solid-state thermal switching/control capabilities based on a variable conductance heat pipe 2 (VCHP) is shown. The VCHP 2 contains a reservoir 6 of non-condensable gas 8 (NCG) that may be controlled via temperature of the reservoir 6. In one implementation, the NCG 8 can be nitrogen gas, for example. A volume of the NCG 8 can expand and contract due to changes in thermal conditions in the reservoir 6 (i.e., vapor temperature, sink temperature, and power input). As the NCG 8 expands into a condenser 10, an area available in the condenser 10 for heat transfer is reduced. The VCHP 2 is typically used when it is desirable for the system to passively adjust to minimize the influence of external thermal conditions on the vapor temperature. It is also possible to actively control the VCHP 2 by heating/cooling the reservoir 6 of the NCG 8. Applying heat to the reservoir 6 will cause the temperature of the NCG 8 to rise. The NCG 8 will then expand into the condenser 10, which blocks the area available for heat transfer and shutting down heat transfer to the condenser 10.

FIGS. 3a and 3b are schematic views of two simple scenarios of operating the VCHP 2. In one implementation, the VCHP 2 can be employed in aircrafts and spacecraft thermal control when an evaporator 4 temperature must be maintained as the power and heat sink conditions vary. It is similar to a conventional heat pipe; however, the VCHP 2 has the reservoir 6 and a controlled amount of non-condensable gas 8 (NCG) inside the reservoir 6. When the VCHP 2 is operating, the NCG 8 is swept toward the condenser 10 end of the VCHP 2 by the flow of a working fluid vapor 12. The NCG 8 then blocks the working fluid 12 from reaching a portion of the condenser 10. The VCHP 2 works by varying the amount of condenser 10 available to the working fluid 12. As the temperature of the evaporator 4 increases, vapor temperature (and pressure) rises, and the NCG 8 compresses and increases an amount of available condenser 10 being exposed to the working fluid 12, as depicted in FIG. 3a. This increases the conductivity of the VCHP 2 and drives the temperature of the evaporator 4 down. Conversely, if the evaporator 4 cools, the vapor pressure drops and the NCG 8 expands, as depicted in FIG. 3b. This reduces the amount of available condenser 10, decreases the heat pipe 2 conductivity, and maintains the evaporator 4 temperature within a small range. In other words, at high heat load, the temperature dependent saturation pressure of the working fluid 12 is high and compresses the NCG 8 into the reservoir 4. At lower heat input, the temperature and pressure of the working fluid 12 is lower, and the NCG 8 expands into the condenser 10.

In some implementations, a measurement device 16 may be employed to measure a property of the NCG 8 and/or the reservoir 4, as shown in FIG. 2. For example, the device 16 may be a temperature device to measure the temperature of the NCG 8 and/or the reservoir 4. In another example, the device 16 may be a pressure device to measure the pressure of the NCG 8 and/or the reservoir 4. In another example, the device 16 may be a temperature regulator to control the temperature of the NCG 8 and/or the reservoir 4. In yet another example, the device 16 may be a pressure regulator to control an amount of pressure of the NCG 8 and/or the reservoir 4.

Figure 4A:
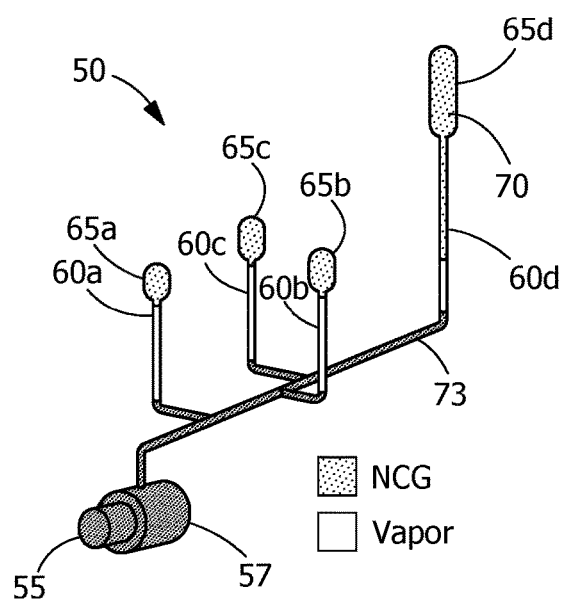
FIGS. 4A-4C are schematic views of a heat transport system, according to an example embodiment of the present disclosure.
Figure 4B:
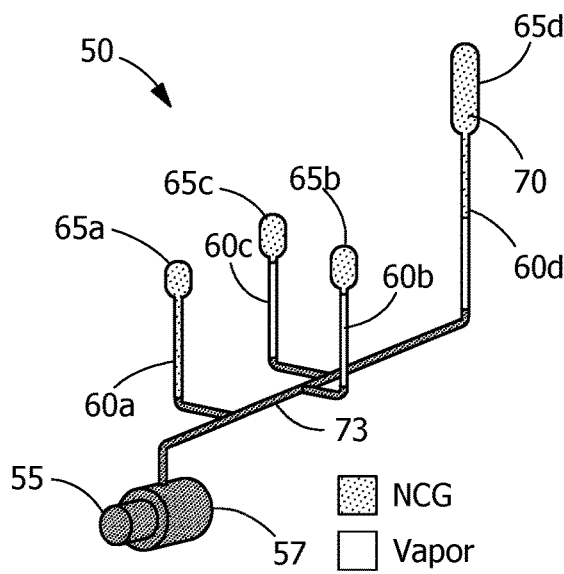
Figure 4C:
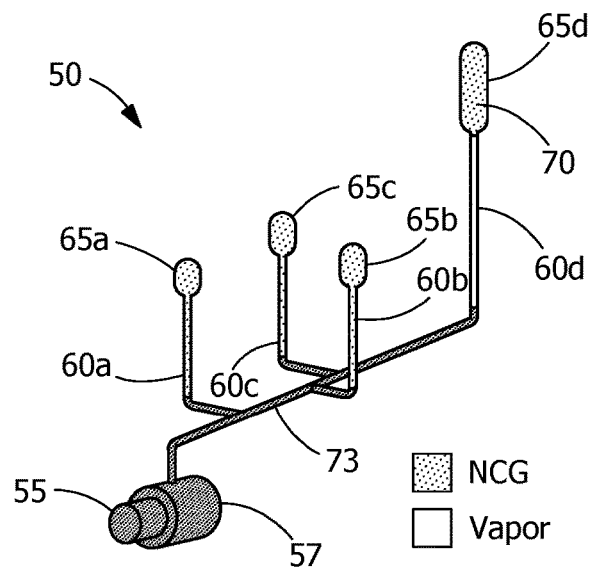

Referring to FIGS. 4A to 4C, a heat transport system 50, according to an example embodiment, is shown. The heat transport system 50 connects a single heat source 55 to multiple end users via a multi-condenser VCHP (MCVCHP) 60a, 60b, 60c, 60d. More specifically, the heat transport system 50 includes a single evaporator 57 connected to four separate condensers 60a, 60b, 60c, 60d (vertical branches) each having their own reservoir 65a, 65b, 65c, 65d of NCG 70, respectively. In some implementations, the heat evaporator 57 is an annular evaporator that interface with the heat source 55 (i.e., heat pump). In one implementation, the heat pump 55 is a thermoacoustic heat pump generating acoustic waves. In the heat transport system 50, reservoirs 65a, 65b, 65c can be actively heated and cooled while reservoir 65d remains at a constant temperature. In other words, reservoirs 65a, 65b, 65c can be heated/cooled in order to control condensers 60a, 60b, 60c and reservoir 65d is not controlled but allows condenser 60d to passively accept additional heat as other condensers are shut off. Such a system reduces the total number of pipes necessary to transport heat to the various end users and provides thermal control capabilities.

The heat transport system 50 operates as follows:

In FIG. 4A, condensers 60a, 60b, 60c are fully open and, as a result, the end users are receiving the maximum amount of heat required. Areas of heat transfer are highlighted and indicated by the dark shading in the respective condensers 60a-60d branching off from a main pipe 73. The NCG 70 is represented by the light shading area in the reservoirs 65a-65d and/or condensers 60a-60d. Condenser 60d is partially open to accept any remaining heat load. The majority of condenser 60d is occupied by NCG 70.

In FIG. 4B, heat has been applied to reservoir 65a causing the NCG 70 to expand into condenser 60a. This blocks heat transfer to this respective end user. Because the amount of power supplied by the heat source is constant, limiting the area for heat transfer will cause a rise in vapor temperature. The vapor is a saturated fluid so an increase in temperature causes an increase in pressure. This pushes the boundary of the vapor and the NCG 70 in condenser 60d increasing the surface area available for heat transfer within condenser 60d. As a result, condenser 60d passively accepts the heat load that was going to condenser 60a with a slight raise in vapor temperature. Accordingly, without condenser 60d passively adjusting, the vapor temperature rise resulting from shutting down condenser 60a would be significant.

In FIG. 4C heat has been applied to reservoirs 65a, 65b, 65c fully blocking condensers 60a, 60b, 60c. As a result, condenser 60d passively adjusts to reject all of the heat load supplied to the system 50.

FIGS. 4A-4C illustrate the multi-condenser VCHP (MCVCHP) according to example embodiments, where heat is supplied to the heat transport system 50 via the heat pump 55 at the evaporator 57, and vapor is free to travel to condensers 60a-60d. In various implementations, a) condensers 60a, 60b, 60c are fully open, condenser 60d accepts additional heat load (FIG. 4A); b) reservoir 65a is heated to shut off condenser 60a. The additional heat load is then passively taken by condenser 60d (FIG. 4B); c) reservoirs 65a, 65b, 65c are heated fully shutting off condensers 60a, 60b, 60c. The entire heat load is now rejected by condenser 60d (FIG. 4C). Therefore, the heat transport system 50 according to these implementations, condensers 60a, 60b, 60c can be controlled independently and continuously from fully open to fully closed.

It should be appreciated that the system illustrated in FIGS. 4A-4C is only one specific realization of the MCVCHP concept, and other designs may be achieved. For example, the system can have an arbitrary number of condensers and/or reservoirs that are actively controlled or passive.

There are many features in utilizing the MCVCHP concept. Some key features are: passive two-phase heat transfer, active thermal control with no moving parts; heat transfer to a given sink can be controlled/modulated continuously from fully off to fully on; designed for an arbitrary number of end users (condensers); and/or required heater power applied to a reservoir in order to shut down a given branch only depends on the system geometry, the vapor temperature, the ambient temperature, and/or heat leaks from the reservoir. A relatively small amount of heater power/control power applied to the reservoir (accounting for heat leaks from the reservoir) can control an arbitrarily large amount of power being transported through the system.

In development, a mathematical model was advanced to size the reservoirs containing the NCG. The reservoir volumes control a distribution of NCG during a startup process. The mathematical model determines the necessary volumes based on geometry of the system, working fluid, and/or design operating temperature. Proper design allows the system to passively distribute the NCG appropriately throughout the system.

Figure 5:
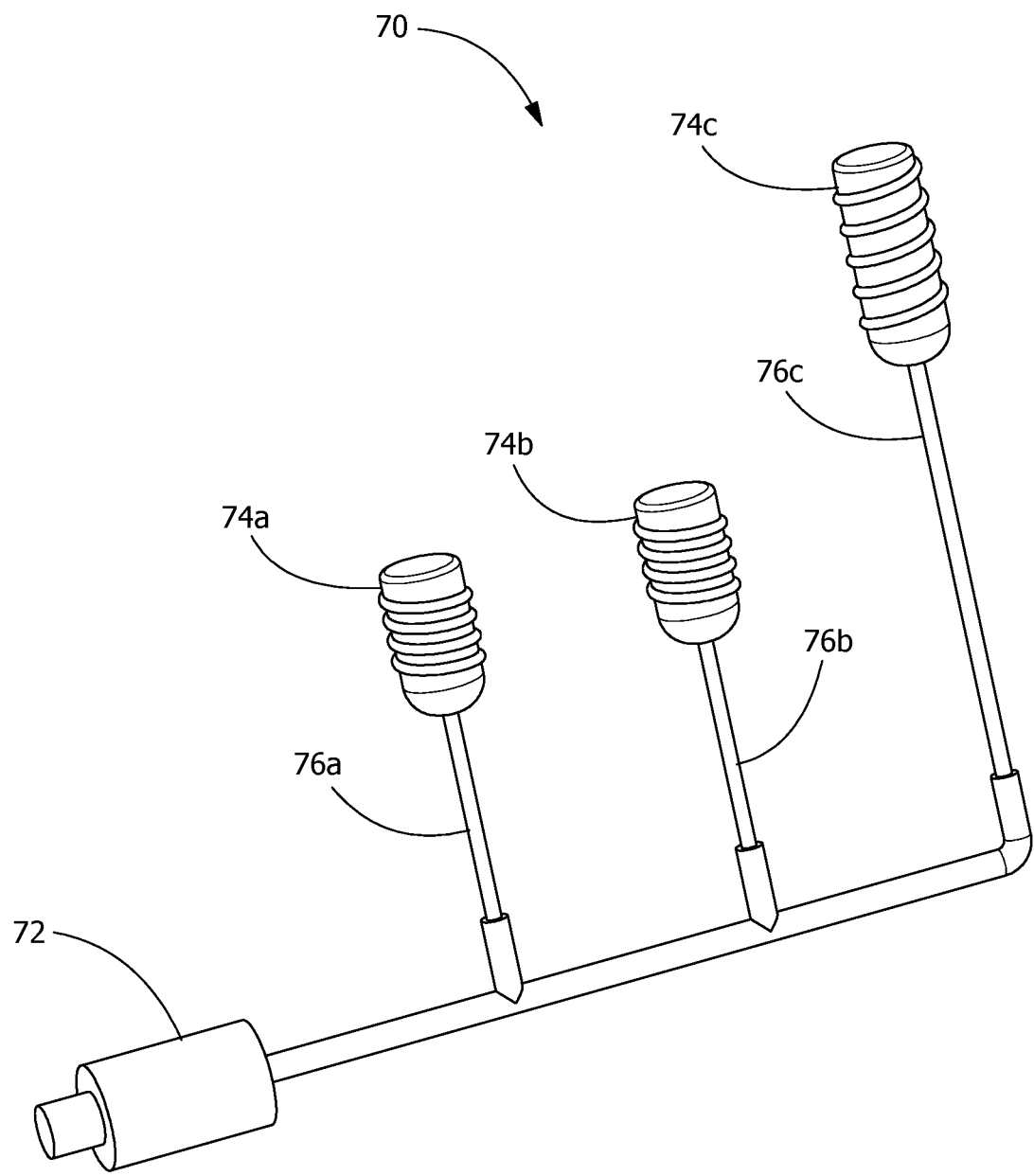
FIG. 5 is a schematic view of a heat transport system, according to another example embodiment of the present disclosure.

For example, as shown in FIG. 5, a first prototype of a multi-condenser VCHP 70 was designed, fabricated and used to experimentally demonstrate the concept. The MCVCHP 70 includes at least a heat source 72, reservoirs 74a, 74b, 74c, and condensers 76a, 76b, 76c. The reservoirs 74a, 74b, 74c were sized using the mathematical model. It should be appreciated that while FIG. 5 illustrates 3 reservoirs and 3 condensers; there may be more than or less than 3 reservoirs and/or condensers employed in this model. In one implementation, the MCVCHP 70 was constructed from stainless steel and used toluene as the working fluid and nitrogen gas as the NCG. Other materials can be used to construct the MCVCHP 70 and/or other fluids can be used as the working fluid and NCG. For example, the MCVCHP 70 can be constructed of other materials, such as, but not limited to, aluminum, copper, nickel, titanium, Monel™, Haynes™ Inconel™, and/or any alloy of the materials listed above. Other working fluids can be, for example, but not limited to, water, ammonia, methanol, propylene, potassium, sodium, and/or lithium. Other gases can be, for example, but not limited to, argon, helium, and/or neon.

Figure 6A:
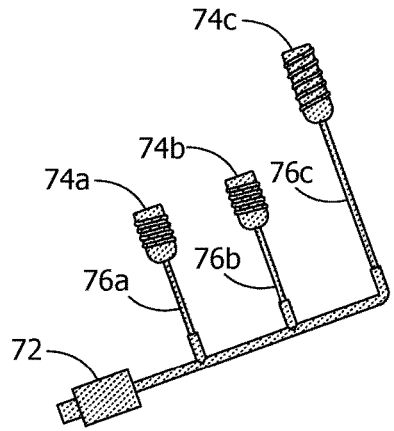
FIGS. 6A-6F are schematic views of a thermal image of the heat transport system of FIG. 5.

In order to demonstrate a startup process of the MCVCHP 70, a qualitative thermal imaging was used. For instance, FIGS. 6A-6F show qualitative thermal images of the MCVCHP 70 at several points during the startup. The sequence of events is as follows:

In FIG. 6A, the entire system begins at ambient temperature. The working fluid (e.g., toluene) can be fully condensed and can occupy a small volume in the evaporator. The remainder of the volume is occupied by toluene vapor (low density and concentration) and NCG.

Figure 6B:
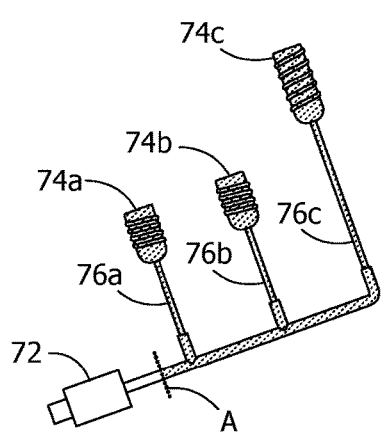

In FIG. 6B, the increased vapor pressure has pushed the NCG front (marked by line A) to just upstream of a first intersection (i.e., branch line connected to the first condenser 76a).

Figure 6C:
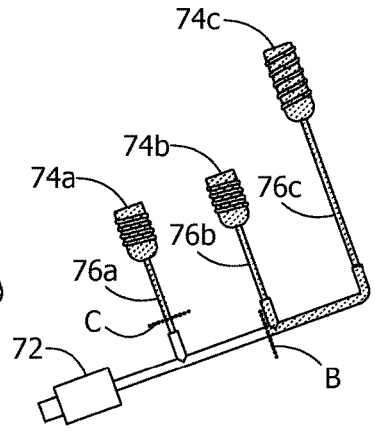

In FIG. 6C, the NCG front A has passed the first intersection (indicated now as a primary front, marked by line B).

The primary front B in the adiabatic section has nearly reached a second intersection (i.e., branch line connected to the second condenser 76b), while a secondary front (marked by line C) has begun moving up the first condenser 76a. At this point, the amount of NCG in a first branch 79a (i.e., the first condenser 76a and the first reservoir 74a) is fixed.

Figure 6D:
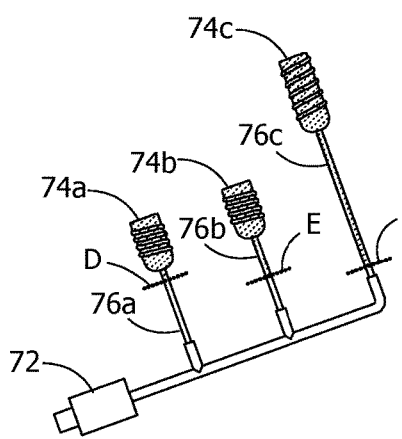
Figure 6E:
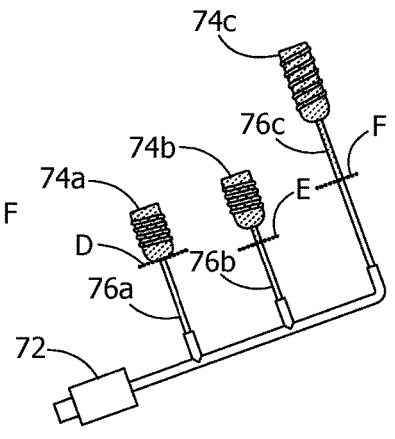

In FIGS. 6D and 6E, there are three separate NCG fronts (marked by lines D, E, F), one in each condenser 76a, 76b, 76c, respectively. As the pressure increases, the front moves faster in the branches with larger reservoirs (i.e., reservoirs 74b, 74c) so that all three fronts D, E, F reach the reservoirs 74a, 74b, 74c (i.e., ends of the condensers 76a, 76b, 76c) at the design temperature.

Figure 6F:
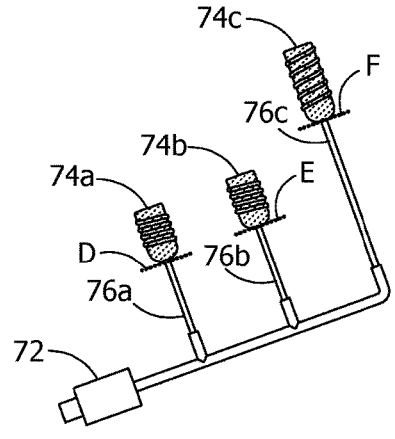

In FIG. 6F, the vapor has reached the design temperature and the NCG fronts D, E, F are all located near entrances to the reservoirs 74a, 74b, 74c and all three condensers 76a, 76b, 76c are fully open.

Figure 7:
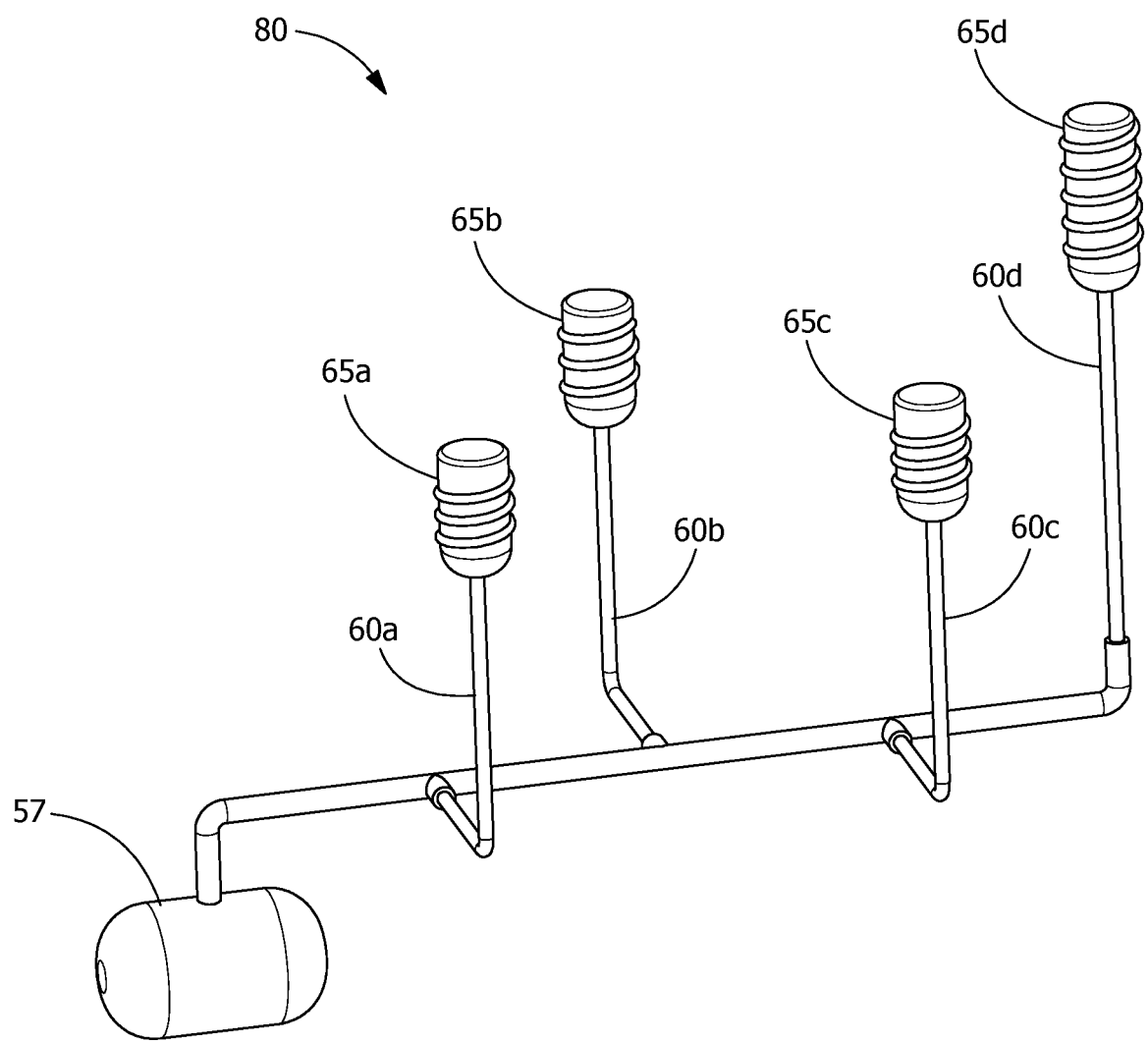
FIG. 7 is a schematic view of a heat transport system, according to another example embodiment of the present disclosure.

Referring to FIG. 7, a second prototype was developed to demonstrate the thermal control capability of the system. FIG. 7 illustrates a second prototype of a MCVCHP 80, which can correspond to the embodiments of FIGS. 4A-4C. The MCVCHP 80 has four condensers 60a-60d and four reservoirs 65a-65d. Condensers 60a, 60b, 60c and reservoirs 65a, 65b, 65c are actively controlled while condenser 60d and reservoir 65d are passive. The reservoirs 65a-65d are sized using the mathematical model described above.

The second MCVCHP 80 was used to experimentally demonstrate the thermal control capability. The design operating temperature of the system was 90° C. The second MCVCHP 80 was constructed from stainless steel and acetone was used as the working fluid and nitrogen gas was used as the NCG. Other materials can be used to construct the MCVCHP 80 and/or other fluids can be used as the working fluid and NCG. For example, the MCVCHP 70 can be constructed of aluminum, copper, nickel, titanium, Monel™, Haynes™, Inconel™, and/or any alloy of the materials listed above. Other working fluids can be, for example, but not limited to, water, ammonia, methanol, propylene, potassium, sodium, and/or lithium. Other gases can be, for example, but not limited to, argon, helium, and/or neon.

Figure 8A:
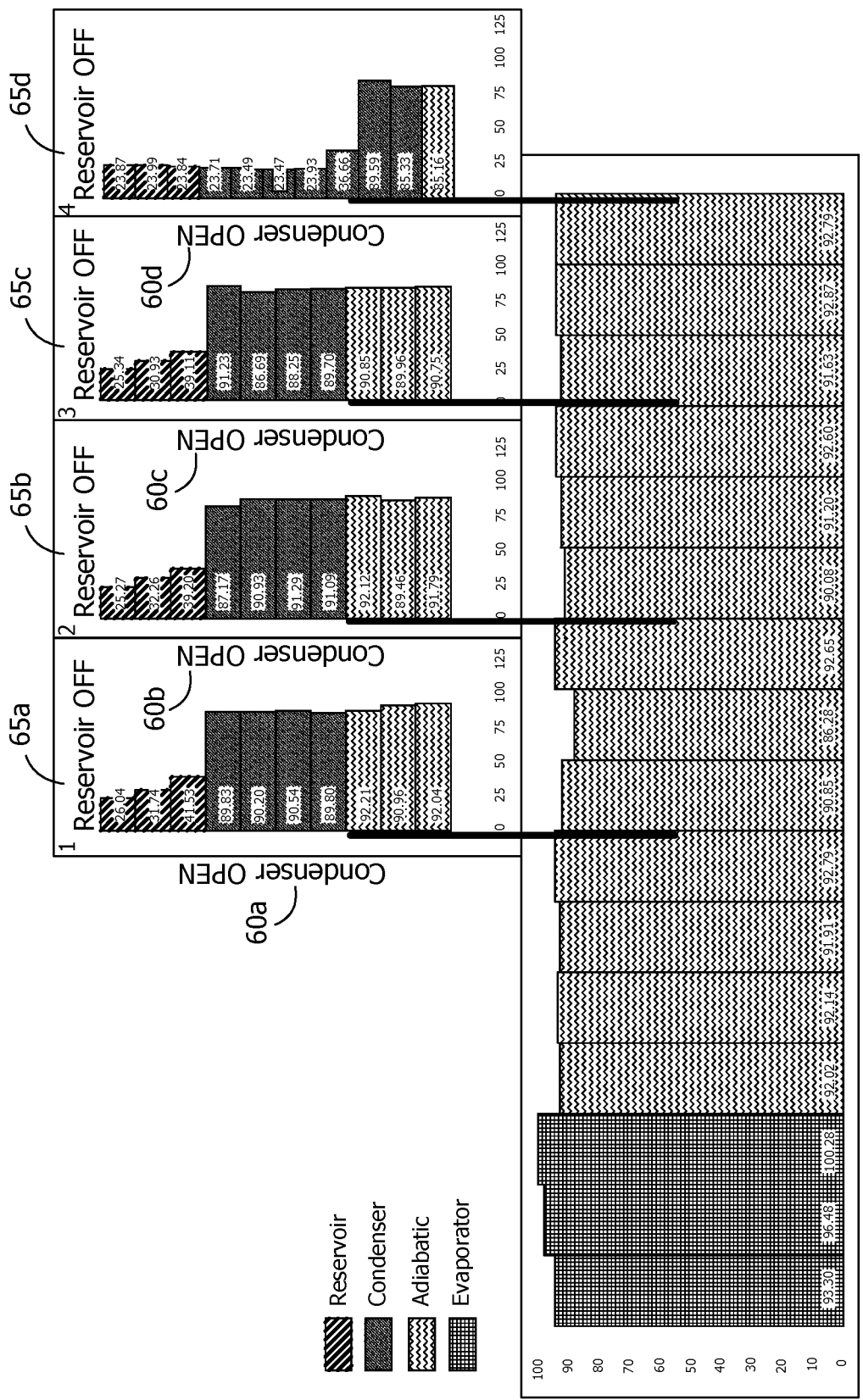
FIGS. 8A and 8B are graphical depictions of a temperature distribution of the heat transport system of FIG. 7.

FIG. 8A shows a temperature distribution of the second MCVCHP 80 near its nominal design operating condition (i.e., 90° C.). It should be appreciated that all temperatures are in Celsius degrees. Some working conditions include the condensers 60a, 60b, 60c being fully open, and the power to the system at 160W. At this power, the average temperature of the adiabatic TCs was approximately 92° C., slightly above the design temperature of 90° C. The temperatures of reservoirs 65a, 65b, 65c are slightly above ambient due to their proximity to hot vapor. The majority of the length of condenser 60d and reservoirs 65a-65d are at the ambient temperature.

Figure 8B:
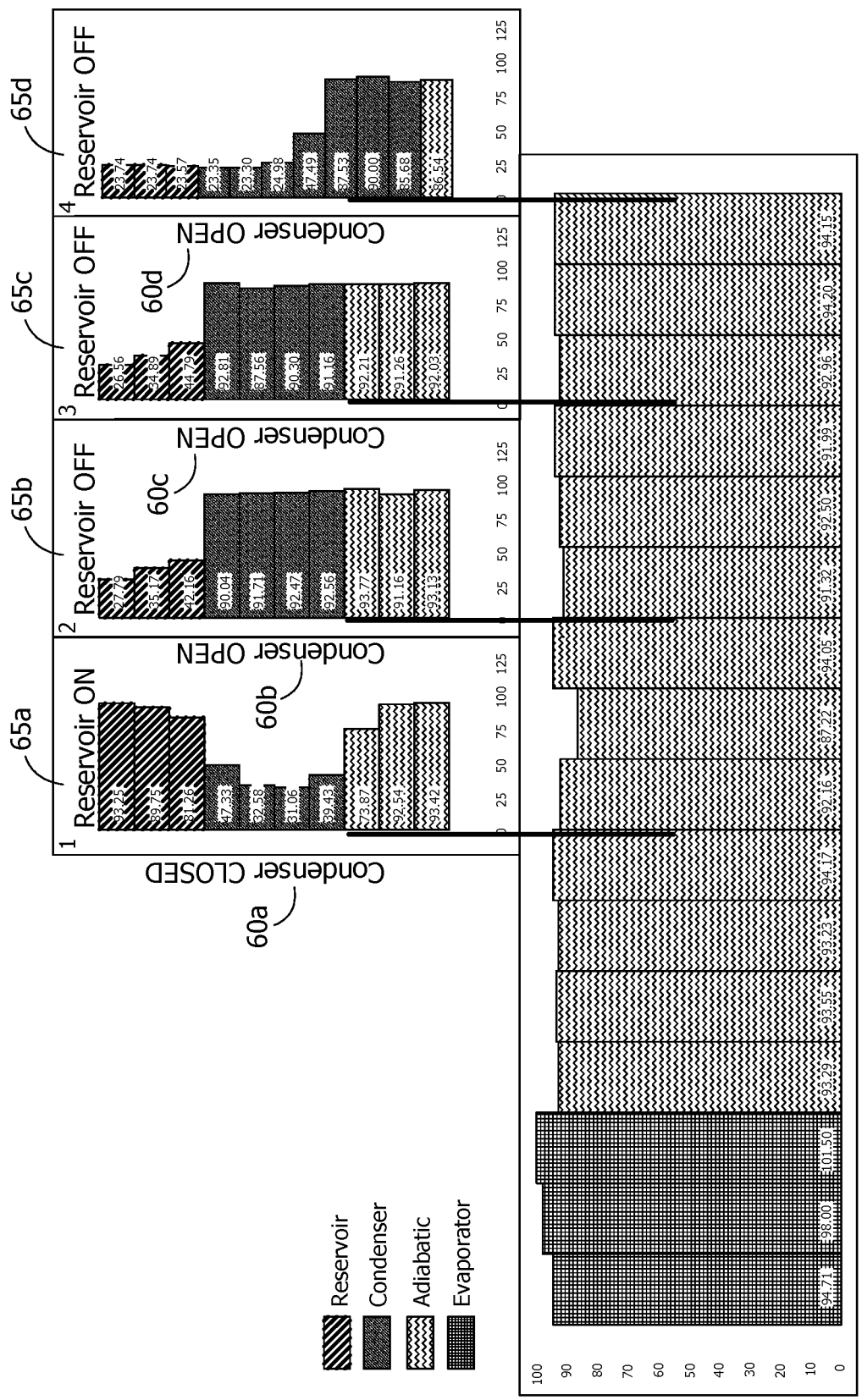

FIG. 8B shows a temperature distribution after applying heater power to reservoir 65a in order to block heat transfer to condenser 60a. It should be appreciated that all temperatures are in Celsius degrees. Some working conditions include the condenser 60a being closed and condensers 60b and 60c being opened, and the power to the system at 160W. The temperature of the outer surface of reservoir 65a was approximately 90° C. and the NCG front can clearly be seen extending into the adiabatic section of a first branch. The second MCVCHP 80 was operated at a constant power. As condenser 60a was shut down, the area available for heat transfer was reduced. This resulted in an increase in vapor temperature which pushed the NCG fronts in condensers 60b, 60c, 60d towards the respective reservoirs 65b, 65c, 65d. Reservoir 65d had the largest volume and therefore the NCG front in condenser 60d was most sensitive to vapor temperature and the front rapidly moved towards reservoir 65d minimizing the vapor temperature rise. With condenser 60a blocked, the average temperature of the adiabatic section increased to approximately 93.2° C. Further experiments successfully demonstrated shutting down the remaining condensers 60b and 60c by applying heater power to reservoirs 65b and 65c.

Figure 9:
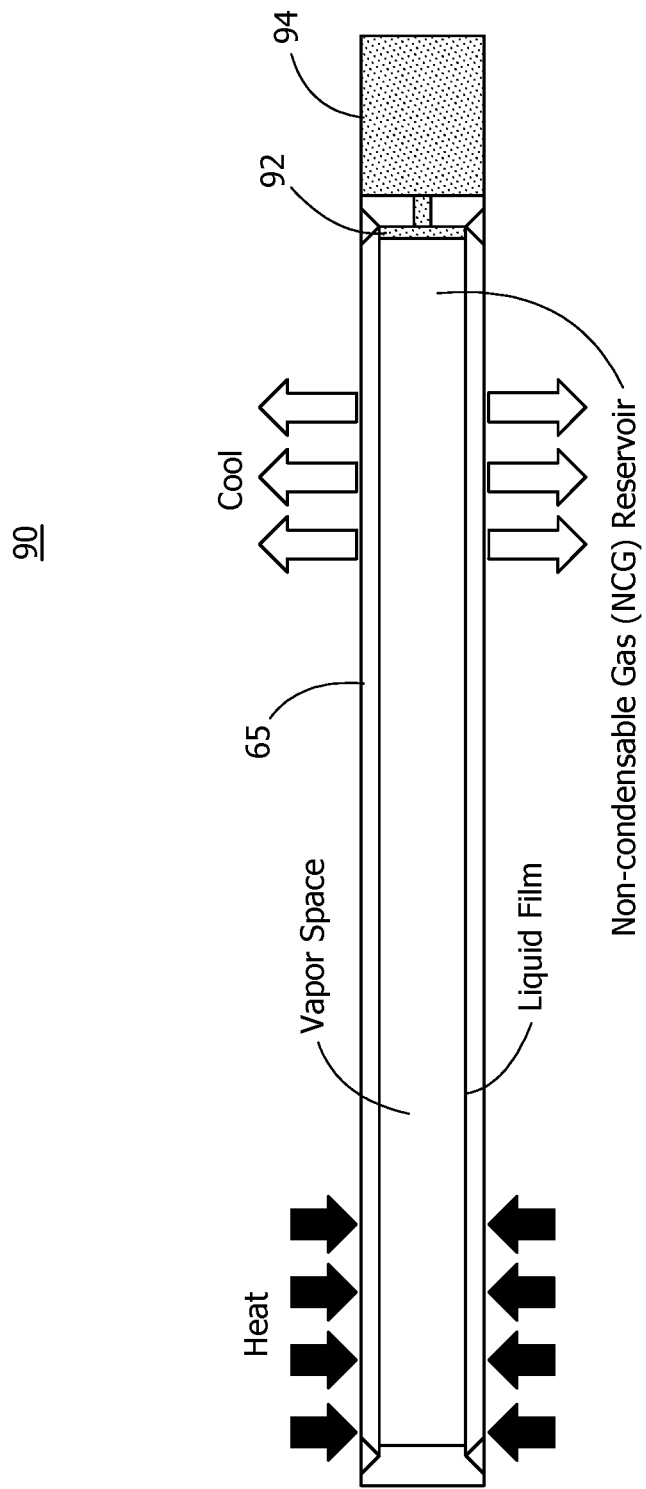
FIG. 9 is a schematic view of a pressure controlled heat pipe in operation, according to an example embodiment of the present disclosure.

FIG. 9 is a schematic view of a pressure controlled heat pipe (PCHP), more specifically, a pressure controlled heat pipe for one or more of the condensers in MCVCHPs. While similar in function and purpose, the PCHP operates in a different manner than the VCHP. For instance, in the VCHP, the NCG is controlled by heating and cooling the reservoirs, while, for PCHP, the NCG is controlled by either changing a volume of the condenser, or by adding/removing the NCG. As a result, the PCHP can achieve greater temperature control by changing the amount of NCG in the system or the reservoir volume. On the other hand, the VCHP has a fixed amount of NCG in the system and a fixed reservoir volume.

Like the VCHP, the functions/operations of the condensers in the PCHP are similar. Specifically, the NCG is swept toward the condenser end of the heat pipe by the flow of the working fluid vapor. The NCG then blocks the working fluid from reaching a portion of the condenser, inactivating a portion of the condenser. In the VCHP, the fraction of condenser blockage is determined by the reservoir size, the non-condensable gas charge, and the operating pressure, and cannot be adjusted once the VCHP is sealed. However, in PCHP, the condenser blockage is actively controlled. In some implementations, the NCG can be added and removed to the reservoir, allowing active control of the condenser length. In other implementations, an actuator drives a bellows to modulate the reservoir volume. This provides more of the condenser being blocked because the reservoir volume has varied (i.e., decreased).

As shown in FIG. 9, a bellows/piston type PCHP 90 includes a piston 92 for reducing the volume inside of the reservoir 65. The piston 92 is operated by an actuator 94 attached to the piston 92. At its initial stage, the piston 92 is withdrawn at higher powers, so that most of the condenser is open. When the heat load is reduced, the piston 92 pushes additional gas into the condenser, helping to maintain the heat pipe at a constant temperature. While a VCHP will passively also increase the condenser blockage, PCHPs are able to react faster, and more precisely.

While some implementations illustrate achieving temperature control via volume modification, it should be appreciated that the NCG can be controlled by adding/removing the NCG. For finer control, both NCG addition/removal and the reservoir volume modification can be combined.

In view of above, the immediate applications of the disclosed concepts are a lightweight and passive system for delivering high-grade waste to various end users on an electric aircraft, for example.

The electric aircraft market is relatively small (~$100 million) and there are no commercial electric aircraft in service. The market is expected to grow rapidly: $5-10 billion by 2030 and ~$100 billion by 2040. Electric aircraft technology is also expected to lead to a billion-dollar industry in urban air mobility (air taxis/delivery/ambulances). As these markets grow and the performance of aircraft increases, the demand for thermal management technology will grow. In fact, the Air Management System Market, which includes systems such as thermal management, engine bleed air, oxygen systems, fuel tanks and ice protection is currently valued at approximately $6 billion and is expected to continue growing at an annual rate of nearly 6%.

The development of electric aircraft technology is currently receiving considerable investment from both government and private industry. There are also a large number of startup companies developing electric aircraft technology, such as vertical take-off vehicles and short-to-medium range passenger jets.

The electric aircraft market is expected to grow considerably over the next several decades and lightweight thermal management systems are critical to their success. Even for high-efficiency electrical components (>95%), electric commercial jetliners are expected to dissipate 100$s$ of kW's of waste heat. Sizing conventional thermal management architectures to handle these new heat loads will incur significant weight penalties due to increased heat exchanger sizes and reduce overall propulsive efficiency due to the power required to pump the coolant and increased drag. The penalties resulting from conventional thermal management system can reduce and even negate the system level benefits of electrified propulsion. The MCVCHP provides a lightweight and solid-state means to transport waste heat from the acoustic heat pump to the various end users onboard the aircraft and provides the ability to modulate the thermal energy delivered to each end user based on individual requirements.

The present MCVCHP system can be applied to any scenario in which thermal power is delivered to multiple heat sinks. For example, thermal energy storage may require heat to be delivered to multiple end users in a controllable manner depending on the end user's needs. Thermal energy storage is relevant in many fields including, but not limited to, spacecraft, concentrated solar power, power plants, and industrial facilities. The MCVCHP system provides a lightweight and simple method of controlling the distribution of thermal energy.

Some innovative features include, but not limited to:

A heat pipe with multiple branches with separate condensers to transport heat from a single source to multiple heat sinks.

Each independent condenser has a dedicated reservoir of non-condensable gas (NCG).

The system is designed to passively distribute the proper amount of NCG into each reservoir during startup.

By actively controlling the temperature of the NCG reservoirs, or the amount of NCG in the reservoir or the volume of the reservoir, heat transfer to a given condenser can be continuously adjusted from fully off to fully on.

A passive condenser/reservoir can be used to passively maintain the system at a nearly constant vapor temperature while other condensers are actively controlled.

Heat transfer and thermal control is achieved without the use of any moving parts, i.e., the system is in fully solid state.

The system is independent of the evaporator design.

The system can operate in thermosyphon mode (gravity-aided) or in a heat pipe mode (capillary driven) depending on the location of the heat sources and heat sinks.

The system can operate in a microgravity environment by using a wick.

The multi-condenser heat pipe system can be applied to a variety of temperature ranges and power requirements with proper selection of the working fluid and envelope material.

Active temperature control of the reservoirs can be obtained through a variety of means, such as, for example, electric resistance heating and cooling to ambient, thermoelectric devices, and/or heating and cooling with a secondary fluid.

The NCG amount can be varied by insertion/extraction and/or a bellows based mechanism A system can be designed for an arbitrary number of end users (condensers).

The required heater power applied to a reservoir in order to shut down a given branch only depends on the system's geometry, the vapor temperature, the ambient temperature, and heat leaks from the reservoir.

A relatively small amount of heater power/control power applied to the reservoir (accounting for heat leaks from the reservoir) can control an arbitrarily large amount of power being transported through the system.

The aspects and embodiments of the invention can be used alone or in combinations with each other.

The articles "a" and "an," as used herein, mean one or more when applied to any feature in embodiments of the present disclosure described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used. The adjective "any" means one, some, or all indiscriminately of whatever quantity.

"At least one," as used herein, means one or more and thus includes individual components as well as mixtures/combinations.

The transitional terms "comprising", "consisting essentially of" and "consisting of", when used in the appended claims, in original and amended form, define the claim scope with respect to what unrecited additional claim elements or steps, if any, are excluded from the scope of the claim(s). The term "comprising" is intended to be inclusive or open-ended and does not exclude any additional, unrecited element, method, step or material. The term "consisting of" excludes any element, step or material other than those specified in the claim and, in the latter instance, impurities ordinarily associated with the specified material(s). The term "consisting essentially of" limits the scope of a claim to the specified elements, steps or material(s) and those that do not materially affect the basic and novel characteristic(s) of the claimed disclosure. All materials and methods described herein that embody the present disclosure can, in alternate embodiments, be more specifically defined by any of the transitional terms "comprising," "consisting essentially of," and "consisting of."

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A thermal management system, comprising:
a heat source;
a heat pipe connected to the heat source and configured to transfer thermal energy from the heat source to a plurality of condensers, each of the plurality of condensers branching off from a main pipe of the heat pipe, the heat pipe being a variable conductance heat pipe containing a working fluid vapor,
wherein at least one of the condensers is controlled upon an activation of another of the plurality of condensers; and
a plurality of reservoirs, each reservoir being connected to one of the plurality of condensers and contains a non-condensable gas therein, wherein the non-condensable gas is in fluid communication with the plurality of condensers.

2. The system of claim 1, wherein the activation comprises controlling thermal conditions, the thermal conditions include activating at least one of: a vapor temperature, a reservoir temperature, or a power input.

3. The system of claim 1, wherein the non-condensable gas expands and contracts due to changes in thermal conditions in the plurality of reservoirs.

4. The system of claim 3, wherein the non-condensable gas expands into the condenser such that an area of the condenser available for heat transfer is reduced.

5. The system of claim 1, wherein the non-condensable gas blocks the working fluid vapor from reaching a portion of the condenser.

6. The system of claim 1, wherein at least one of the reservoirs remains at a constant temperature.

7. The system of claim 6, wherein temperatures of the other reservoirs vary to be actively heated or cooled.

8. The system of claim 1, wherein the non-condensable gas contained in the plurality of reservoirs is actively controlled by at least one of: an electric resistance heating and cooling to ambient temperature, a thermoelectric device, or a heating and cooling via a secondary fluid.

9. The system of claim 1, wherein a number of condensers is four.

10. The system of claim 1, wherein a number of reservoirs is four.

11. The system of claim 1, further comprising:
an evaporator configured to vaporize the working fluid and transfer thermal energy through the heat pipe,
wherein the vaporized working fluid flows to the plurality of condensers where the plurality of condensers condenses the vaporized working fluid into a liquid and returned to the evaporator.

12. A thermal management system, comprising:
a heat pipe configured to transfer thermal energy from a heat source to a plurality of condensers, the heat pipe being a variable conductance heat pipe containing a working fluid vapor,
wherein each of the plurality of condensers includes a reservoir containing a non-condensable gas, and
wherein at least one of the plurality of condensers is controlled by at least one of: heating or cooling the respective reservoir of the non-condensable gas, changing a volume of the respective reservoir, or changing an amount of non-condensable gas in the respective reservoir.

13. The system of claim 12, wherein heating or cooling the respective reservoir includes activating at least one of: a vapor temperature, a reservoir temperature, or a power input.

14. The system of claim 12, wherein changing the volume of the respective reservoir includes bellows.

15. The system of claim 12, wherein changing the amount of non-condensable gas in the respective reservoir includes adding or extracting of the non-condensable gas in the respective reservoir.

16. A method of controlling heat being delivered to end users via a heat pipe, the method comprising:
extracting waste heat from a heat source;
transferring the waste heat to a plurality of condensers connected to a variable conductance heat pipe containing a working fluid;
controlling at least one of the plurality of condensers to operate the working fluid to flow to the other plurality of condensers; and controlling a plurality of reservoirs that are fluidly connected to the plurality of condensers, each reservoir containing a non-condensable gas.

17. The method of claim 16, wherein the non-condensable gas expands and contracts due to changes in thermal conditions in the plurality of reservoirs.

18. The method of claim 16, wherein controlling at least one of the plurality of condensers includes changing a volume of one of the plurality of reservoirs.

19. The method of claim 18, wherein changing the volume of one of the plurality of reservoirs includes bellows.

20. The method of claim 16, wherein controlling at least one of the plurality of condensers includes changing an amount of the non-condensable gas contained in one of the plurality of reservoirs.

21. The method of claim 20, wherein the changing the amount of the non-condensable gas includes adding or extracting of the non-condensable gas in one of the plurality of reservoirs.

\* \* \* \* \*